United States Patent
Mnich et al.

(10) Patent No.: US 9,231,592 B1
(45) Date of Patent: Jan. 5, 2016

(54) METHOD FOR SYNCHRONIZING A MULTIPLICITY OF CLOCK GENERATING CIRCUITS

(71) Applicant: Aeroflex Colorado Springs Inc., Colorado Springs, CO (US)

(72) Inventors: Christopher Mnich, Colorado Springs, CO (US); Jonathan Mabra, Colorado Springs, CO (US)

(73) Assignee: Aeroflex Colorado Springs Inc., Colorado Springs, CO (US)

(*) Notice: Subject to any disclaimer, the term of this patent is extended or adjusted under 35 U.S.C. 154(b) by 0 days.

(21) Appl. No.: 14/469,361

(22) Filed: Aug. 26, 2014

(51) Int. Cl.
- G06F 1/04 (2006.01)
- H03K 3/00 (2006.01)
- H03K 19/003 (2006.01)
- H03K 19/23 (2006.01)
- G06F 1/12 (2006.01)

(52) U.S. Cl.
CPC ............... H03K 19/003 (2013.01); G06F 1/12 (2013.01); H03K 19/23 (2013.01)

(58) Field of Classification Search
CPC ......... G06F 1/04; G06F 13/1689; G06F 1/12; H03K 3/00
USPC ............................ 326/9, 11, 93; 327/291, 298
See application file for complete search history.

(56) References Cited

U.S. PATENT DOCUMENTS

2008/0250185 A1* 10/2008 Clark .................. G06F 1/04 710/306

* cited by examiner

Primary Examiner — Daniel D Chang
(74) Attorney, Agent, or Firm — Hogan Lovells US LLP; Peter J. Meza

(57) ABSTRACT

A clock generating circuit includes oscillators each having a delay rise vote input, a delay fall vote input, a delay rise output, a delay fall output, and a clock output; a vote rise circuit having inputs coupled individually to the delay rise outputs of the oscillators, and an output coupled in common to the delay rise vote inputs of the oscillators; a vote fall circuit having inputs coupled individually to the delay fall outputs of the oscillators, and an output coupled in common to the delay fall vote inputs of the oscillators; and a vote clock circuit having inputs coupled individually to the clock outputs of the oscillators, and an output for providing a synchronized clock signal.

26 Claims, 4 Drawing Sheets

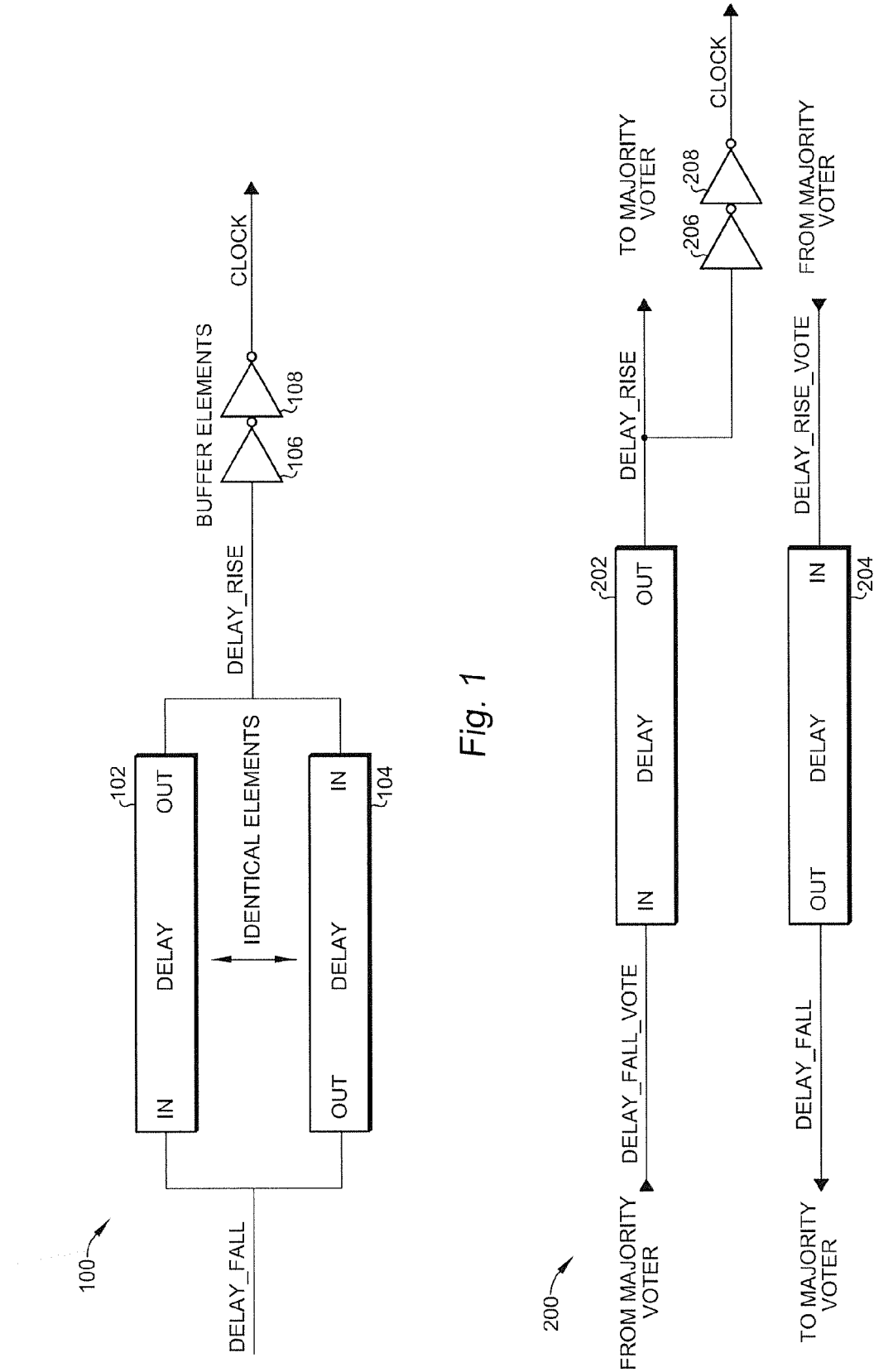

METHOD FOR SYNCHRONIZING A MULTIPLICITY OF CLOCK GENERATING CIRCUITS

FIELD OF THE INVENTION

The present invention relates to clock circuits and oscillator circuits for generating a clock signal and more particularly to a system of circuits and corresponding method of synchronizing a multiplicity of clock generating circuits whereby the starting point of the generation of the rising and falling edges of an output clock signal are each determined by the majority vote of the states of the opposite edge from the system of circuits.

BACKGROUND OF THE INVENTION

In certain applications synchronization is required between multiple clock generating circuits. Each clock generating circuit nominally generates the same frequency within an error tolerance of the desired frequency. With the exception of the synchronization between the circuits, each circuit operates independently.

What is desired is a method and circuit for synchronizing a multiplicity of clock generating circuits whereby the starting point of the generation of the rising and falling edges are each determined by the majority vote of the states of the opposite edge from the system of circuits so that a reliably synchronized output clock signal can be provided.

SUMMARY OF THE INVENTION

The present invention uses a method of synchronizing a multiplicity of clock generating circuits whereby the starting point of the generation of the rising and falling edges are each determined by the majority vote of the states of the opposite edge from the system of circuits. According to the present invention, a clock generating circuit comprises a plurality of oscillators each having a delay rise vote input, a delay fall vote input, a delay rise output, a delay fall output, and a clock output; a vote rise circuit having a plurality of inputs coupled individually to the delay rise outputs of the plurality of oscillators, and an output coupled in common to the delay rise vote inputs of the plurality of oscillators; a vote fall circuit having a plurality of inputs coupled individually to the delay fall outputs of the plurality of oscillators, and an output coupled in common to the delay fall vote inputs of the plurality of oscillators; and a vote clock circuit having a plurality of inputs coupled individually to the clock outputs of the plurality of oscillators, and an output for providing a clock signal. Each oscillator comprises a first delay circuit coupled between the delay fall vote input and the delay rise output; and a second delay circuit coupled between the delay rise vote input and the delay fall output. The first and second delay circuits are substantially identical. Each oscillator comprises two serially-coupled inverters between the delay rise output and the clock output. The vote rise circuit comprises a majority voter circuit. The vote fall circuit comprises a majority voter circuit. The vote clock circuit comprises a majority voter circuit. The clock signal comprises a 50% duty cycle clock signal, but does not require a 50% duty cycle to be valid.

According to another embodiment of the present invention, a clock generating circuit comprises a plurality of oscillators each having a delay rise vote input, a delay fall vote input, a delay rise output, a delay fall output, and a clock output; a vote rise circuit having a plurality of inputs coupled individually to the delay rise outputs of the plurality of oscillators, and an output coupled in common to the delay rise vote inputs of the plurality of oscillators; and a vote fall circuit having a plurality of inputs coupled individually to the delay fall outputs of the plurality of oscillators, and an output coupled in common to the delay fall vote inputs of the plurality of oscillators, wherein a signal at the common delay rise vote input is used to generate a clock signal.

According to yet another embodiment of the present invention, a clock generating circuit comprises a plurality of oscillators each having a delay rise vote input, a delay fall vote input, a delay rise output, a delay fall output, and a clock output; a vote rise circuit having a plurality of inputs coupled individually to the delay rise outputs of the plurality of oscillators, and an output coupled in common to the delay rise vote inputs of the plurality of oscillators; and a vote fall circuit having a plurality of inputs coupled individually to the delay fall outputs of the plurality of oscillators, and an output coupled in common to the delay fall vote inputs of the plurality of oscillators, wherein a signal at the common delay fall vote input is used to generate a clock signal.

According to the present invention a self-synchronizing system of clock generating circuits is presented whereby majority vote functions on both the rising and falling edges keep the system synchronized during both clock phases. It is an advantage of the circuit of the present invention over other prior art solutions that it does not require any external signaling to synchronize the system of circuits and provides a reliable clock output signal when used in harsh environments. The circuit of the present invention can be used with any circuit technology and can be used to create robust clock sources that are used in harsh environments where upsets are likely.

BRIEF DESCRIPTION OF THE DRAWINGS

FIG. 1 is a schematic diagram of a basic oscillator circuit according to the prior art;

FIG. 2 is a schematic diagram of a modified oscillator circuit according to the present invention;

DETAILED DESCRIPTION

Figure 3:
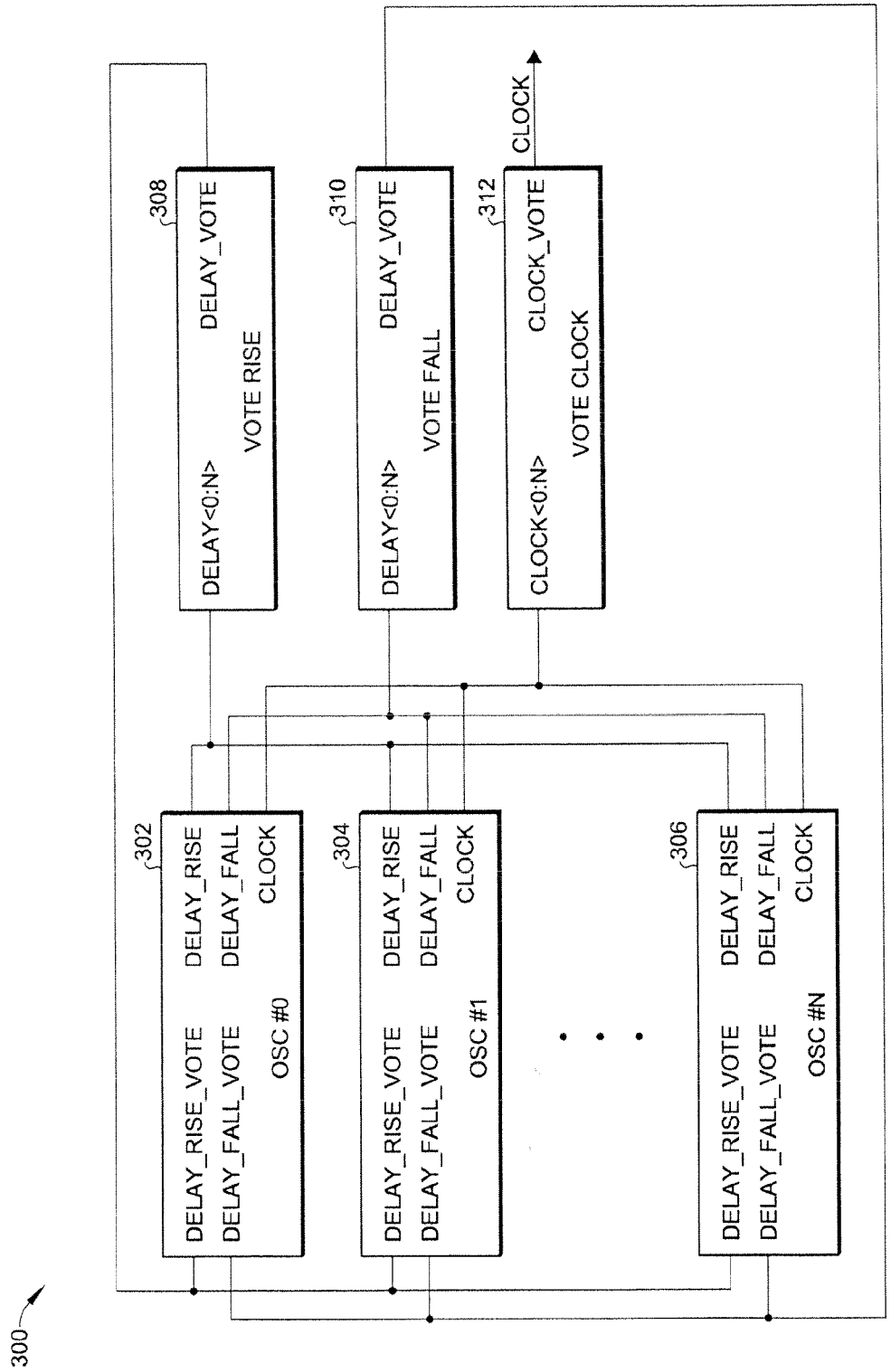
FIG. 3 is a schematic diagram of "N" oscillator circuit with corresponding majority voter circuits according to the clock generating circuit of the present invention.

The clock generating circuit of the present invention is self-synchronized with low relative error. The duty cycle of the output clock signal according to the present invention is also an important consideration (ideally it would be 50%, although the present invention can be used with any duty cycle).

To keep the high and low pulse-widths approximately equal (duty cycle~50%), each oscillator is broken up into two stages. These stages are comprised of identical delay elements, where the output from the first delay element determines the condition of the second delay element and the second delay element determines the condition of the first delay element. That is, a loop is created where half the loop is identical to the other half.

The block diagram in FIG. 1 illustrates the description of a single instance of an oscillator having identical delay stages to preserve duty cycle. Basic oscillator 100 includes a first delay circuit 102 having an input and an output, and a substantially similar second delay circuit 104 having an input and an output. The input of delay circuit 102 is coupled to the output of delay circuit 104, and generates the DELAY_FALL signal. The output of delay circuit 102 is coupled to input of delay circuit 104, and generates the DELAY_RISE signal. The DELAY_RISE signal is buffered by inverter buffer elements 106 and 108 to provide the output CLOCK signal.

In order to synchronize multiple instances of the previously described oscillators, the DELAY_FALL, DELAY_RISE, and CLOCK signals (shown in FIG. 1) from each oscillator instance are brought out to a set of majority voter elements (one voter per signal). The results from the majority voter elements are returned to the appropriate point in each oscillator instance. Each oscillator according to the present invention now looks like the schematic diagram 200 shown in FIG. 2.

The modified oscillator 200 according to the present invention includes a first delay circuit 202 having an input for receiving the DELAY_FALL_VOTE signal generated by a majority voter circuit as will be explained in further detail below with respect to FIG. 3. Delay circuit 202 also has an output for generating the DELAY_RISE signal, which is buffered through inverters 206 and 208 to provide the output CLOCK signal. It will be apparent to those skilled in the art that other buffer circuits can be used. The DELAY_RISE signal is sent to the majority voter circuit as is also described below with respect to FIG. 3. Modified oscillator 200 according to the present invention also includes a second delay circuit 204 having an input for receiving the DELAY_RISE_VOTE signal from the majority voter circuit and an output for providing the DELAY_FALL signal that is sent to the majority voter circuit.

The block diagram 300 in FIG. 3 shows multiple instances 302, 304, and 306 of the modified oscillator 200 from FIG. 2 and how they are used with the majority voter circuits 308, 310, and 312 to form a synchronized clock generating circuit. The following is a description of how the elements described in FIG. 3 work together to achieve synchronization between all the oscillators.

In FIG. 3, "N" oscillators are used, wherein "N" is an integer. Each oscillator circuit 302, 304, and 306 is shown including the DELAY_RISE_VOTE and DELAY_FALL_VOTE input signals, the DELAY_RISE and DELAY_FALL output signals, and the CLOCK output signal. Oscillator circuit 302 is designated "OSC #0", oscillator circuit 304 is designated "OSC #1", and oscillator circuit 306 is designated "OSC #N". Each majority voter circuit 308, 310, and 312 includes a DELAY<0:N> input ("N" individual inputs) and a DELAY_VOTE or CLOCK_VOTE output.

The majority voter circuits 308, 310, and 312 output the value that is of the highest occurrence among the inputs; that is, if there are more "1's" than there are "0's", the output is a "1", if there are more "0's" than "1's", the output is a "0". Assume that all the oscillators start with their DELAY_RISE and DELAY_FALL signals in the "0" and "1" state (respectively). The output of the falling voter (VOTE FALL circuit 310) will be a "1" and the output of the rising voter (VOTE RISE circuit 308) will be a "0". During this time the delay element for the low time of the output (DELAY_RISE) will be engaged. After the majority of the DELAY_RISE signals get to the "1" state, the DELAY_RISE_VOTE signal will transition to a "1", which will engage the delay element for the high time of the output (DELAY_FALL). After the majority of the DELAY_FALL signals get to the "1" state, the DELAY_FALL_VOTE signal will transition to a "1" and the cycle will continue to oscillate in this fashion. Since the vote signals are used to start each oscillator on each half of a cycle, the outputs will stay synchronized and the duty cycle will not be degraded. If an instance of the oscillator were to be faster or slower than the majority of the other instances, that particular instance would effectively be ignored and would have its outputs become slave to the majority of all the other instances' outputs.

The previously described method according to the present invention more than adequately addresses the initial problem. Within a single period of the oscillator the system oscillators become synchronized. Once synchronization occurs, any single instance of the oscillator that tries to change frequency will be instantly forced into the majority state and will therefore remain synchronized indefinitely. Note that in the above description and the previous figures the buffered output of each oscillator is presented to reflect the actual behavior of the currently implemented solution. Depending upon the specific application, one skilled in the art could use the DELAY_RISE_VOTE or the DELAY_FALL_VOTE or a derivative thereof to generate the final output instead of the separate vote method described above. The primary focus is on the method described to synchronize each half of the oscillator period.

Figure 4:
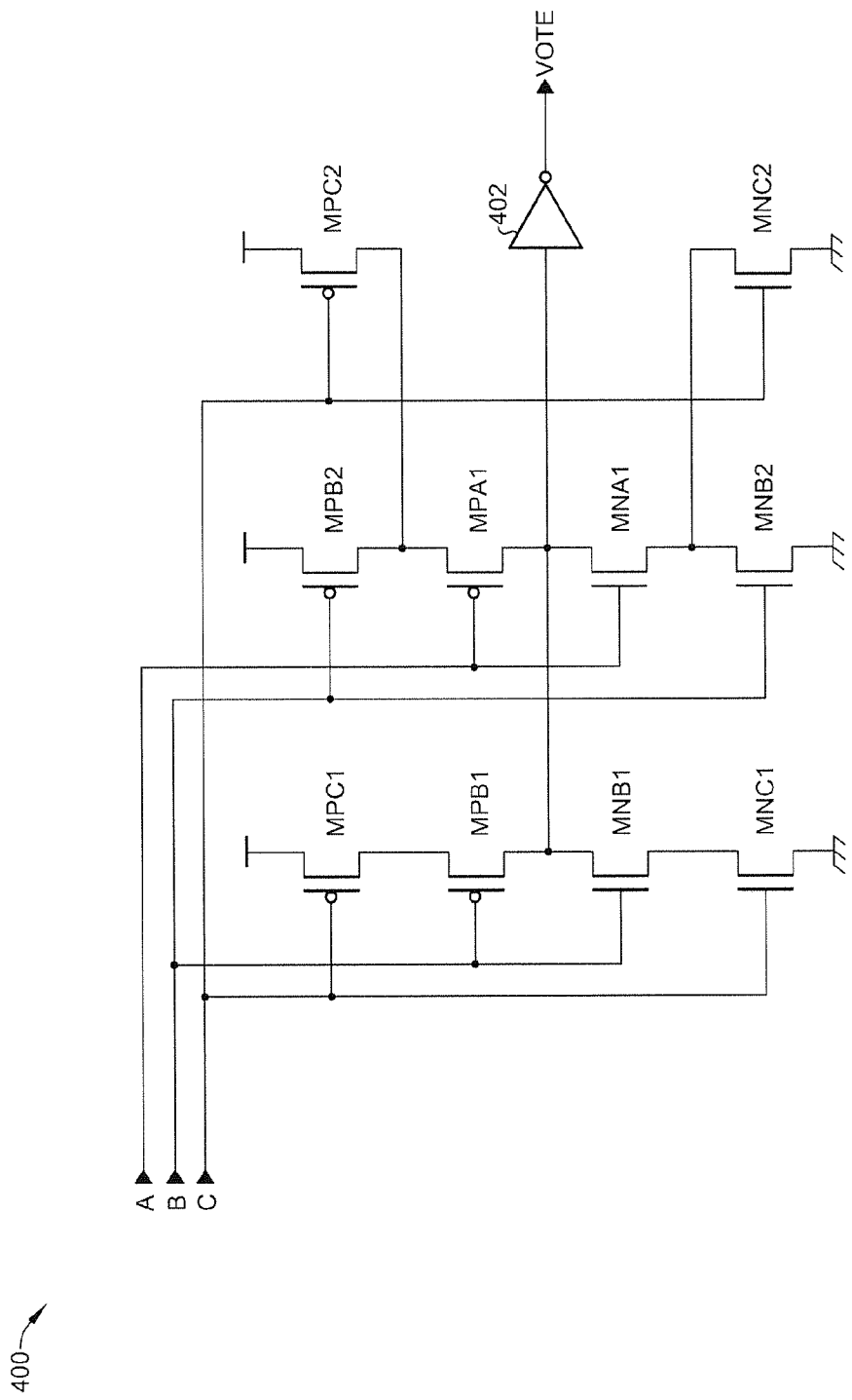
FIG. 4 is a schematic diagram of a three input majority voter circuit that can be used in the present invention.

FIG. 4 shows a three-input majority voter circuit 400, which includes inputs A, B, and C, and a VOTE output. If any two inputs have the same data state, then the VOTE output will have that same data state. A first four input inverter includes transistors MPC1, MPB1, MNB1, and MNC1, coupled to the B and C inputs as shown. The output of the first four input inverter is coupled to the input of output inverter 402. A second four input inverter includes transistors MPB2, MPA1, MNA1, and MNB2, coupled to the A and B inputs as shown. The output of the second four input inverter is also coupled to the input of output inverter 402. Transistors MPC2 and MNC2 are coupled to the C input and to intermediate nodes of the second four input inverter. The output inverter 402 provides the VOTE output signal.

Figure 5:
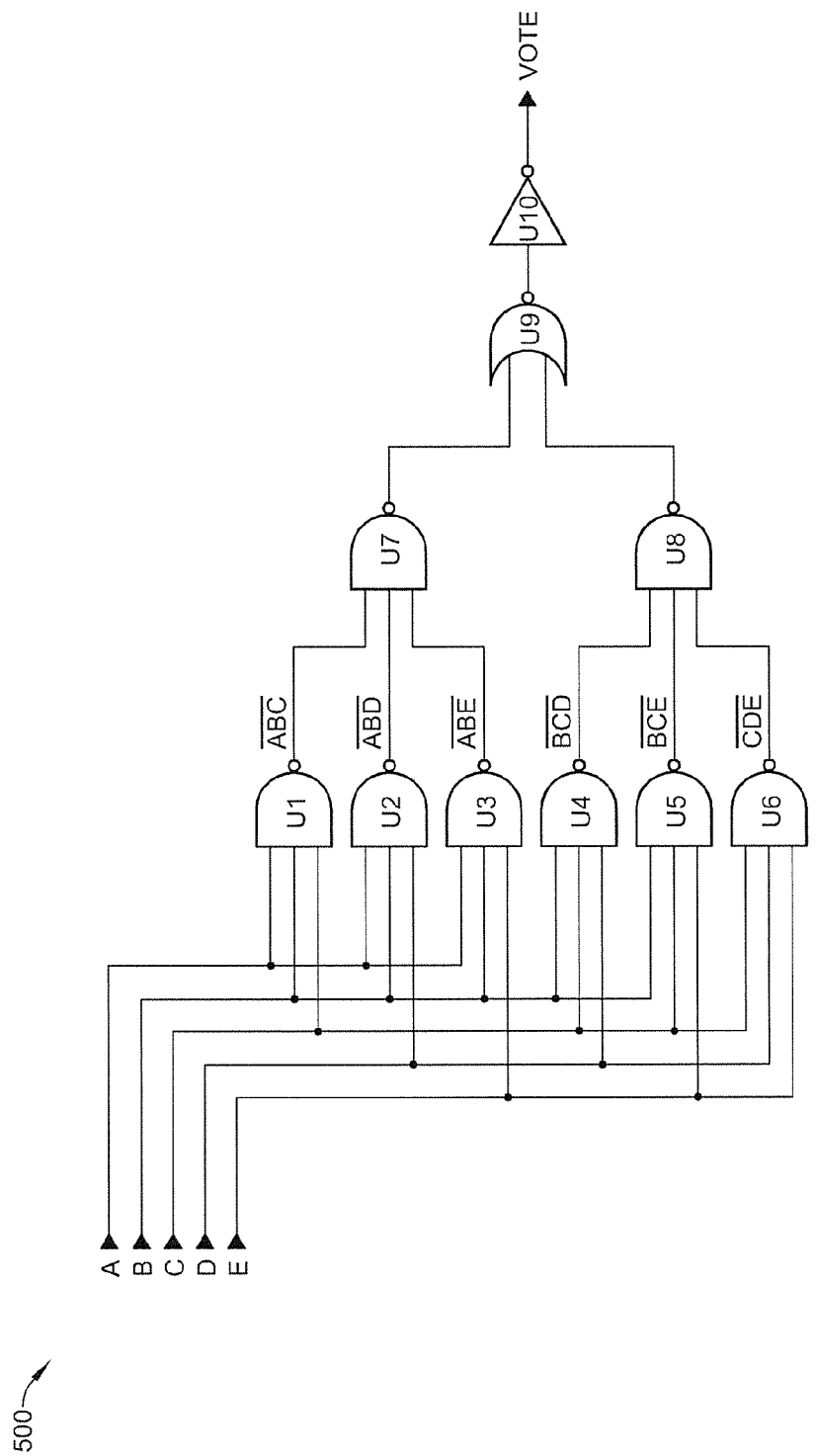
FIG. 5 is a schematic diagram of a majority voter circuit that can be expanded to include any number of inputs and can also be used in the present invention.

FIG. 5 shows a Boolean majority voter circuit 500 that can be used to detect the majority of the data states of the inputs and output that state on the VOTE output. In FIG. 5, circuit 500 detects three data states among the five inputs A, B, C, D, and E. While five inputs are shown, circuit 500 can be expanded to accommodate any number of inputs. Majority voter circuit 500 includes a first set of three input AND gates U1, U2, U3, U4, U5, and U6 coupled to the A, B, C, D, and E inputs as shown. A second set of three input AND gates U7 and U8 is coupled to the outputs of AND gates U1, U2, U3, U4, U5, and U6 as shown. Finally, an OR gate U9 is coupled to the outputs of OR gates U7 and U8, and an inverter U10 is coupled to the output of OR gate U9 to provide the VOTE output signal.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A clock generating circuit comprising:
  a plurality of oscillators each having a delay rise vote input, a delay fall vote input, a delay rise output, a delay fall output, and a clock output;
  a vote rise circuit having a plurality of inputs coupled individually to the delay rise outputs of the plurality of oscillators, and an output coupled in common to the delay rise vote inputs of the plurality of oscillators;

a vote fall circuit having a plurality of inputs coupled individually to the delay fall outputs of the plurality of oscillators, and an output coupled in common to the delay fall vote inputs of the plurality of oscillators; and a vote clock circuit having a plurality of inputs coupled individually to the clock outputs of the plurality of oscillators, and an output for providing a clock signal.

2. The clock generating circuit of claim 1 wherein each oscillator comprises:

a first delay circuit coupled between the delay fall vote input and the delay rise output; and a second delay circuit coupled between the delay rise vote input and the delay fall output.

3. The clock generating circuit of claim 2 wherein the first and second delay circuits are substantially identical.

4. The clock generating circuit of claim 2 wherein the first and second delay circuits are different.

5. The clock generating circuit of claim 1 wherein each oscillator comprises two serially-coupled inverters between the delay rise output and the clock output.

6. The clock generating circuit of claim 1 wherein the vote rise circuit comprises a majority voter circuit.

7. The clock generating circuit of claim 1 wherein the vote fall circuit comprises a majority voter circuit.

8. The clock generating circuit of claim 1 wherein the vote clock circuit comprises a majority voter circuit.

9. The clock generating circuit of claim 1 wherein the clock signal comprises a 50% duty cycle clock signal.

10. The clock generating circuit of claim 1 wherein the clock signal comprises a non-50% duty cycle clock signal.

11. A clock generating circuit comprising:

a plurality of oscillators each having a delay rise vote input, a delay fall vote input, a delay rise output, a delay fall output, and a clock output;

a vote rise circuit having a plurality of inputs coupled individually to the delay rise outputs of the plurality of oscillators, and an output coupled in common to the delay rise vote inputs of the plurality of oscillators; and a vote fall circuit having a plurality of inputs coupled individually to the delay fall outputs of the plurality of oscillators, and an output coupled in common to the delay fall vote inputs of the plurality of oscillators, wherein a signal at the common delay rise vote input is used to generate a clock signal.

12. The clock generating circuit of claim 11 wherein each oscillator comprises:

a first delay circuit coupled between the delay fall vote input and the delay rise output; and a second delay circuit coupled between the delay rise vote input and the delay fall output.

13. The clock generating circuit of claim 12 wherein the first and second delay circuits are substantially identical.

14. The clock generating circuit of claim 12 wherein the first and second delay circuits are different.

15. The clock generating circuit of claim 11 wherein the vote rise circuit comprises a majority voter circuit.

16. The clock generating circuit of claim 11 wherein the vote fall circuit comprises a majority voter circuit.

17. The clock generating circuit of claim 11 wherein the clock signal comprises a 50% duty cycle clock signal.

18. The clock generating circuit of claim 11 wherein the clock signal comprises a non-50% duty cycle clock signal.

19. A clock generating circuit comprising:

a plurality of oscillators each having a delay rise vote input, a delay fall vote input, a delay rise output, a delay fall output, and a clock output;

a vote rise circuit having a plurality of inputs coupled individually to the delay rise outputs of the plurality of oscillators, and an output coupled in common to the delay rise vote inputs of the plurality of oscillators; and a vote fall circuit having a plurality of inputs coupled individually to the delay fall outputs of the plurality of oscillators, and an output coupled in common to the delay fall vote inputs of the plurality of oscillators, wherein a signal at the common delay fall vote input is used to generate a clock signal.

20. The clock generating circuit of claim 19 wherein each oscillator comprises:

a first delay circuit coupled between the delay fall vote input and the delay rise output; and a second delay circuit coupled between the delay rise vote input and the delay fall output.

21. The clock generating circuit of claim 20 wherein the first and second delay circuits are substantially identical.

22. The clock generating circuit of claim 20 wherein the first and second delay circuits are different.

23. The clock generating circuit of claim 19 wherein the vote rise circuit comprises a majority voter circuit.

24. The clock generating circuit of claim 19 wherein the vote fall circuit comprises a majority voter circuit.

25. The clock generating circuit of claim 19 wherein the clock signal comprises a 50% duty cycle clock signal.

26. The clock generating circuit of claim 19 wherein the clock signal comprises a non-50% duty cycle clock signal.

* * * * *